(12) United States Patent
Simmons et al.

(10) Patent No.: US 6,787,237 B2
(45) Date of Patent: Sep. 7, 2004

(54) ROOM TEMPERATURE STABLE EPOXY PREPREGS

(75) Inventors: Martin Simmons, Cambridge (GB); John Cawse, Castle Camps (GB); John Ellis, Cambridge (GB)

(73) Assignee: Hexcel Corporation, Dublin, CA (US)

( * ) Notice: Subject to any disclaimer, the term of this patent is extended or adjusted under 35 U.S.C. 154(b) by 0 days.

(21) Appl. No.: 10/243,077

(22) Filed: Sep. 12, 2002

(65) Prior Publication Data

US 2003/0064223 A1 Apr. 3, 2003

(30) Foreign Application Priority Data

Sep. 14, 2001 (GB) .............................................. 0122195

(51) Int. Cl.$^7$ .............................................. B32B 27/38
(52) U.S. Cl. .................... 428/413; 428/297.4; 428/365; 525/523
(58) Field of Search .............................. 428/413, 297.5, 428/365, 375, 414, 292.1, 297.4; 442/104, 131, 149, 150, 152, 164, 172, 151; 525/523

(56) References Cited

U.S. PATENT DOCUMENTS

| | | |
|---|---|---|
| 4,421,897 A | 12/1983 | Gutekunst et al. |
| 5,969,060 A | 10/1999 | Arai |
| 6,011,130 A | 1/2000 | Arai et al. |
| 6,531,549 B2 * | 3/2003 | Murata et al. .............. 525/523 |
| 2001/0037003 A1 * | 11/2001 | Miyake et al. .............. 525/506 |

FOREIGN PATENT DOCUMENTS

| | | | |
|---|---|---|---|
| JP | 08-325395 | * | 12/1996 |
| JP | 10-202814 | * | 8/1998 |

OTHER PUBLICATIONS

Machine Translation, JP 10–202814, Shidara et al., Aug. 1998.*
Machine Translation, JP 08–325395, Umezawa et al., Dec. 10, 1996.*
Product Data Sheet for diyandiamide, obtained from www.chemicalland21.com.*
Product Information: D.E.R. 332 Liquid Epoxy Resin, from Dow Plastics (a business group of The Dow Chemical Company and its subsidiaries), published Dec. 2000.

* cited by examiner

Primary Examiner—David J. Buttner
Assistant Examiner—Christopher Keehan
(74) Attorney, Agent, or Firm—Shapiro & Dupont LLP

(57) ABSTRACT

Uncured composite materials (prepreg) are provided that are stable at room temperature over relatively long periods of time. The prepreg includes a solid epoxy resin matrix composed of a crystalline epoxy resin and a solid curing agent. The curing agent is preferably crystalline. The prepreg may include one or more property enhancement layers that increase the tackiness of the prepreg, increase the flexibility of the prepreg and/or reduce the amount of solid resin matrix that flakes from the prepreg during handling.

29 Claims, 1 Drawing Sheet

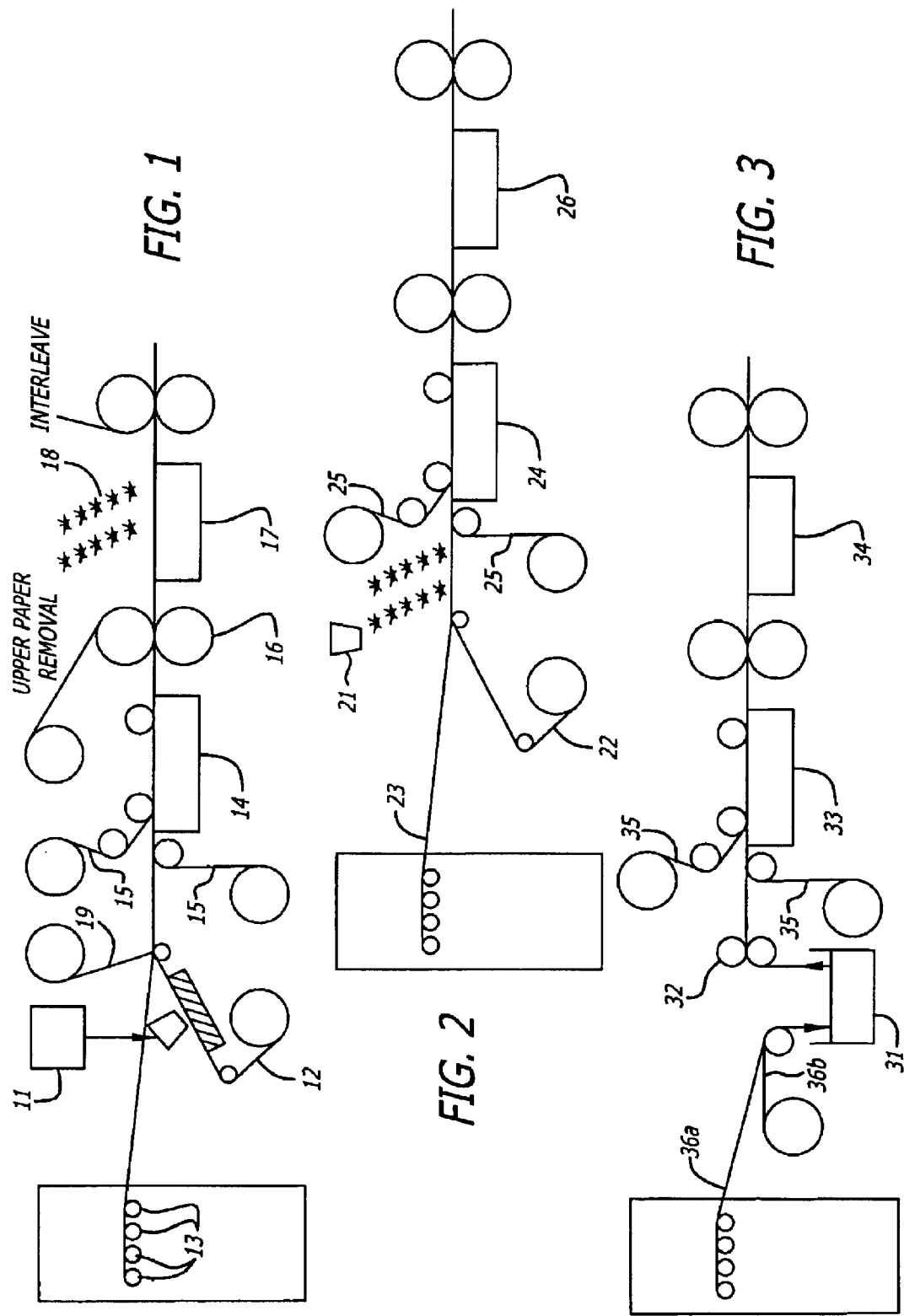

ROOM TEMPERATURE STABLE EPOXY PREPREGS

BACKGROUND OF THE INVENTION

1. Field of the Invention

The present invention relates generally to epoxy resin composite materials. More particularly, the present invention is directed to uncured epoxy resin composite materials that may be stored over relatively long periods of time at room temperature.

2. Description of Related Art

Fibrous reinforced resin compositions are widely used as structural components, in industrial and leisure applications, in aerospace and for electronic circuit board applications. A multitude of various combinations of fibers and resins are presently in use. These fiber/resin compositions are generally referred to as "composite materials" or simply "composites". In many instances, the fibers and resin are combined in a suitable mold and immediately cured to form the finished product. Alternatively, the fibers and resin are combined with an appropriate curing agent and stored in an uncured state for future use. These types of pre-impregnated uncured composites are generally referred to as "prepreg".

Epoxy resins have been used as the resin matrix for a wide variety of composites. Epoxy resin prepreg typically includes a fibrous reinforcement that is embedded in an uncured resin matrix. The uncured resin matrix includes one or more liquid resins and one or more curing agents. The uncured resin matrix may also include additives such as tougheners, flame retardants, fillers and the like. Prepregs that include an epoxy matrix resin generally are cured at temperatures in the range from 50° C. to 200° C.

Epoxy prepregs have limited preservation stability at room temperature due to the presence of curing agent(s) in the resin matrix. This is particularly evident in low-temperature cure epoxy prepreg compositions. For example, a prepreg that includes an epoxy resin and an imidazole curing agent, that can be cured at 60° C., can have a room temperature stability of less than two days rendering it unusable thereafter. Stability during storage at room temperature is important, especially if materials are to be transported long distances, and/or stored at ambient temperatures before use. It is, of course, possible to store these known prepregs at temperatures below room temperature to enhance their shelf life, but the need for large or expensive refrigeration units make this option undesirable.

Additionally it is essential that the matrix resin does not flow out of the fibrous reinforcement phase of the prepreg during storage or lay-up. This may be achieved by formulating solid epoxy resins, which have high molecular weights, or formulating highly viscous epoxy resins.

It is also desirable for at least one side of the prepreg to have a certain degree of tack. This is required during the lay up of prepreg materials. If the prepreg has no tack it can prove difficult to assemble together layers of prepreg in the mold.

It is, furthermore, desirable that the prepreg has a certain degree of flexibility to enable it to be formed into the desired shape. This is also required if the prepreg is to be supplied in rolls.

It is well known that epoxy resins may crystallize at room temperature but this is commonly regarded as a disadvantage and even a nuisance, because the crystallization can interfere with the mixing and other operations used in the manufacture of a conventional prepreg material.

SUMMARY OF THE INVENTION

According to a first aspect of the present invention there is provided an uncured composite material or prepreg that includes a fibrous reinforcement and a crystalline epoxy resin and a solid epoxy resin curing agent, wherein the epoxy resin curing agent is substantially uniformly dispersed in the crystalline epoxy resin. The uncured composite material includes an uncured composite body that has at least one side and is composed of fibers imbedded in a substantially crystallized solid matrix. The solid matrix includes a solids mixture of the crystallized epoxy resin and a solid curing agent that is preferably also crystallized.

The side of the uncured composite material has a certain level of tackiness and the uncured composite body has a certain degree of flexibility. In addition, a certain amount of the solid matrix flakes from the uncured composite body when it undergoes flexing. As a feature of the present invention, a property enhancement material is located within the composite body or as a layer located on the side of the uncured composite material. The enhancement agent is preferably an adhesive or flexibilizing agent. It was discovered that the use of an adhesive as the enhancement agent not only increases the tackiness of the uncured composite body, but also unexpectedly increases the flexibility of the body as well as reducing the amount of solid matrix that flakes from the body during flexing.

The epoxy resin prepreg compositions of the invention have excellent room temperature stability, typically of 3 to 6 months, thus providing increased room temperature shelf life. Furthermore they may be cured at a conveniently low temperature in the range from 50° C. to 200° C., and preferably at temperatures lower than 100° C., and most preferably in the temperature range 40–70° C. The use of epoxy resin that has been crystallized has no effect on the mechanical properties of the cured composite material compared with an epoxy resin that is not crystallized.

The above discussed and many other features and attendant advantages of the present invention will become better understood by reference to the detailed description when taken in conjunction with the accompanying drawings.

BRIEF DESCRIPTION OF THE DRAWINGS

FIG. 1 is a schematic diagram showing one process for making uncured composite material in accordance with the invention.

FIG. 2 is a schematic diagram showing a second process for making uncured composite material in accordance with the invention.

FIG. 3 is a schematic diagram showing a third process for making uncured composite material in accordance with the invention.

DETAILED DESCRIPTION OF THE INVENTION

The uncured composite materials in accordance with the present invention include a composite body that has at least one side. Although many different shapes are possible, the composite body is preferably in the form of a pre-impregnated woven or non-woven fabric or mat that has two sides. The fabric or fibrous reinforcement may be made from organic or inorganic fibers either alone or in combination. Examples include carbon fibers, glass fibers, aramid fibers, polyethylene fibers, and ceramic fibers. Natural fibers such as kenaf, hemp and cellulose may also be used. The fibers may be utilized in unidirectional form, or as non-wovens, such as multi-axial fabrics or non-crimped fabrics, or may be present as a woven fabric or non-woven mat or fabric or combinations thereof. More than one layer of fibers may be present in the prepreg.

The epoxy resin prepreg composition of the present invention may be loaded onto the fibrous reinforcement in quantities in the range from 30–3000 $gm^{-2}$.

The epoxy resin must be crystalline, i.e. the resin must be pure enough to become substantially crystallized when cooled to temperatures at which the resin normally becomes a solid. Substantially crystallized means that the solid resin is at least 90 percent in the crystalline form and preferably at least 95 percent crystalline. Preferred epoxy resins include diglycidyl ethers of bisphenol A and bisphenol F and their halogenated derivatives and can be represented by the general formula:

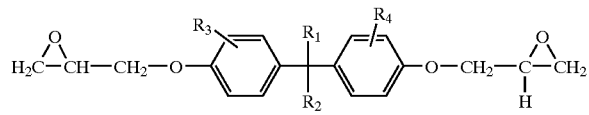

where $R^1$ is hydrogen, halogen or a hydrocarbon group with one to six carbon atoms or may with $R^2$ form part of a ring;

$R^2$ is hydrogen, halogen or a hydrocarbon group with one to six carbon atoms or may with $R^1$ form part of a ring;

$R^3$ is hydrogen, halogen or a hydrocarbon group with one to six carbon atoms; and $R^4$ is hydrogen, halogen or a hydrocarbon group with one to six carbon atoms.

The aforementioned resins can be used alone or as a mixture with other liquid crystallizable resins or solid resins that are substantially crystallized.

The melting point of these epoxy resins is typically between 25° C. and 100° C. and preferably in the range from 35° C. to 50° C.

Whether a particular epoxy resin may be used in accordance with the present invention may be determined by routine experimentation or by information contained in the resin specifications provided by each resin manufacturer. Epoxy resin manufacturers routinely provide information on the crystal forming properties of individual epoxy resins. For example, DER 332 as supplied by Dow Chemical is a pure form of a diglycidyl ether of bisphenol A that is stated by the manufacturer to undergo crystallization. Rutapox 0158 as supplied by Bakelite is a diglycidyl ether of bisphenol F that is also suitable for the invention. Although supplied as liquids, these resins are known to crystallize at temperatures below 25° C. Crystallization may be enhanced by seeding the liquid with crystals of the epoxy.

If the manufacturer specifications are not available, the suitability of a given epoxy resin for use in the present invention is simply determined by cooling the liquid resin and measuring the degree of crystal formation as the resin becomes a solid. Epoxy resins that become at least 90 percent crystalline in the solid state are suitable. If desired or necessary, preformed crystals of the particular epoxy resin may be added to the liquid resin to provide nucleation sites to enhance crystal formation.

The epoxy curing agent must be a solid. The curing agent may be mixed with the epoxy resin when the epoxy is in a liquid or solid form. The temperature of the liquid epoxy must be maintained below the melting point of the curing agent so that the curing agent remains as an amorphous or crystalline solid dispersed within the liquid resin. The curing agent and epoxy resin may be mixed together when they are both solids to form a solids mixture. It is preferred that the curing agent is a crystalline solid. A crystalline solid is one in which the curing agent is substantially crystallized. A substantially crystallize curing agent is one in which the solid agent is at least 90 percent crystalline and preferably at least 95 percent crystalline.

Preferred curing agents include any compounds that give latent thermal cure of at least five to seven days. Such compounds are well known to those skilled in the art. Suitable examples include imidazoles and their salts and adducts. These epoxy curing agents are solid at room temperature. Preferred examples of suitable curing agents are disclosed in EP 906927A. Other preferred curing agents include aromatic amines, aliphatic amines, anhydrides and phenols. The suitability of the curing agent for use in the present invention may be determined by reference to manufacturer specifications or routine experimentation. Manufacturer specifications may be used to determine if the curing agent is an amorphous solid or a crystalline solid at the desired temperatures for mixing with the liquid or solid epoxy. Alternatively, the solid curing agent may be tested using simple crystallography to determine the amorphous or crystalline nature of the solid curing agent and the suitability of the curing agent for mixing with the epoxy resin in either liquid or solid form. The melting point for the solid curing agent must be higher than the melting point of the epoxy resin.

The uncured resin matrix of the present invention may additionally comprise insoluble thermoplastic toughening particles, resin soluble thermoplastic toughening agent which precipitate upon curing, release agents to facilitate release from the mold and flame retardants which may be intumescent. Other modifiers that are well known to those in the art may also be used provided that they do not adversely affect the crystalline nature of the matrix.

The uncured matrix resins preferably contain a flexibilizing agent. The flexibilizing agent is selected so as to have substantially no effect on shelf life or the ability of the major epoxy component to be present as a crystallized solid. Liquid rubbers, epoxy novolacs, acrylate monomers, methacrylate monomers and vinyl esters, are examples of suitable flexibilizing agents. These can be added as a minor component of the composition so as not to prevent the crystallization of the major epoxy resin component.

An example of a liquid rubber that is suitable as a flexibilizing agent is HYCAR 1300 X18 (trademark) as supplied by BF Goodrich. An example of a vinyl ester resin that is suitable as a flexibilizing agent is Actilane 320, supplied by Akzo Nobel. The flexibilizing agent is preferably present in an amount from 1 to 10% by weight of the resin matrix.

Property enhancement materials, such as flexibilizing agents and adhesives, may also be included as a property enhancement layer on at least one surface of the uncured prepreg. Preferably, both sides of the prepreg are coated with the property enhancement layer. The properties that are enhanced include tackiness, flexibility and/or flakiness. Prepreg that include a solid resin matrix typically have relatively low tackiness and are relatively brittle. In addition, flakes of the solid resin matrix tend to depart the prepreg when it is handled or otherwise subjected to flexing. Adhesives and flexibilizing agents are the preferred materials that are used to form the property enhancement layers. It was discovered that the use of one type of enhancement agent provides improvements in multiple properties. For example, when the prepreg surfaces are coated with an adhesive, the flexibility of the prepreg is increased and the amount of solid matrix that flakes from the prepreg is reduced. This is in addition to the increase in tackiness provided by the adhesive layer.

Flexibilizing agent, when used in the property enhancement layers, may be added to the composition by spraying the liquid agent onto the surface of the prepreg or applying the agent to release paper and then transferring the agent to the prepreg. The same flexibilizing agents that may be incorporated directly into the epoxy resin matrix may also be used in the property enhancement layer.

Tackifying agents that are suitable for the property enhancement layer include pressure sensitive adhesives such as those based on polyurethanes, acrylates, natural rubber and others, and which may be in the form of solutions, aerosols, dispersions or emulsions. The tackifying agent may also include a mixture of the above agents in a liquid epoxy resin carrier. If epoxy resin is used as the carrier, it is preferably a crystallizable epoxy.

The tackifying agent is applied to at least one face of one or more of the crystallized epoxy resin prepreg of the present invention by spraying the liquid agent onto the surface of the prepreg or applying the agent to release paper and then transferring the agent to the prepreg or by a printing technique or by any other suitable means. The thickness of the property enhancement layer will vary depending upon which agents are present in the layer and the size of the underlying composite body. Preferably, the property enhancement coating will be as thin as possible while still providing a measurable increase in tackiness and flexibility of the composite body and/or a measurable decrease in flaking.

The uncured matrix resin may additionally include one or more inorganic filler. Preferred fillers include silica, alumina, aluminum powder, titanium dioxide, aluminum hydroxide and talc. Further minor ingredients may be included in the composition such as any of the following: accelerators, thermoplastics and core shell rubbers, flame retardants which may be intumescent, wetting agents, pigments/dyes, UV absorbers, toughening particles and viscosity modifiers.

The epoxy resin prepreg of the present invention may also include electrically conductive mesh for dissipating lightning strikes. The epoxy resin prepreg of the present invention may be coated with a surface finishing film on at lease one face. The matrix resin may additionally comprise insoluble thermoplastic toughening particles, resin soluble thermoplastic toughening agents that precipitate upon curing and release agents to facilitate release from a mold.

The process for making the uncured composite material involves substantially uniformly mixing the solid epoxy resin curing agent with the liquid or solid epoxy resin to form a liquid or solid solution of the curing agent in the epoxy resin. The fibrous reinforcement is then impregnated with the resulting mixture. If the epoxy resin is in a liquid form, the combined resin and fibers are cooled to a temperature at which the resin crystallizes. The prepreg is left at this low temperature for a sufficient time to allow complete crystallization of the resin matrix. If the epoxy resin is in a solid form, the solids mixture does not require any additional cooling. If desired, the solids mixture may be heated to melt the epoxy resin, but not the curing agent. The melted mixture is then allowed to interact with the fibers to provide a more uniform distribution of the resin matrix. The melted mixture is then cooled to recrystallize the epoxy resin.

Any process for producing the uncured epoxy resin matrix may be used as long as the said epoxy curing agent is uniformly dispersed within the liquid or solid crystalline epoxy resin. The method can be carried out in the molten state, solid state or by mixing the components in a solvent. This mixing is preferably carried out at room temperature. If the temperature exceeds 50° C. the epoxy curing agent may initiate polymerization of the epoxy resin.

The uncured resin composition is applied to a fibrous reinforcement to form a prepreg. Preferably this process will occur at or close to room temperature. If too high a temperature is used, the uncured resin composition may start to cure affecting recrystallization of the epoxy resin and ultimately the room temperature storage stability. If the fibers are impregnated with liquid epoxy resin, the resin must be cooled to a temperature lower than the melting point of the epoxy and preferably at a temperature lower than 10° C. This process is required to ensure that the epoxy matrix resin is substantially in a crystalline form.

Reinforcing fibers may be synthetic or natural fibers, such as carbon, glass, aramid, hemp, kenaf, or any other form of material or combination of materials that, combined with the resin composition of the invention, forms a composition product. In FIGS. 1, 2 and 3 the reinforcement web can either be provided via spools of fiber which are unwound or from a roll of textile.

Referring to FIG. 1, a crystalline epoxy is heated to a temperature above its melting point and is then allowed to cool to room temperature. A crystalline epoxy curing agent is then uniformly mixed with the liquid resin and a flexibilizing agent to provide a mixture which is fed via feeder 11 onto the moving web 12, which may be release paper, release paper coated with a tackifying film, or textile. If the resin is coated onto release paper then fiber from spools 13 or a textile 19 or both may be added to the web as reinforcement materials. A mixture 15 of epoxy resin and tackifier may be added via lamination of a pre-coated film to either or both sides of the main web if required. The web and resin pass over a heated table 14 with pressure rolls into a heated compaction nip 16 to complete impregnation. Heat is applied at a temperature which is lower than the melting point of the epoxy curing agent, but equal to or higher than the melting point of the epoxy resin. The impregnated web, also known as a prepreg, is then cooled by a refrigeration unit 17 to a temperature lower than the melting point of the epoxy resin but preferably to a temperature lower than 10° C. to allow the epoxy resin to recrystallize. The recyrstallization can be accelerated if required by adding epoxy resin crystals 18 as a nucleating agent. The prepreg is then stored at a temperature, preferably −5° C. to +10° C., for 2 days to complete the crystallization process. Once the epoxy resin is fully crystallized the prepreg can be stored at room temperature or below the melting point of the epoxy resin.

Referring to FIG. 2, an alternative process for making prepreg in accordance with the invention is shown in which a crystalline epoxy resin is ground together with a crystalline epoxy curing agent so as to provide an intimate mixture 21. This mixture is then fed, with a predetermined loading, onto the web 22 or 23. The web is then fed through a heater 24 via which heat is applied at a temperature which is lower than the melting point of the epoxy curing agent, but equal to or higher than the melting point of the epoxy resin. A mixture 25 of epoxy resin and tackifier may be added via lamination of a pre-coated film to either or both sides of the main web to form property enhancement layers. The melted mixture of liquid epoxy resin and solid epoxy curing agent will now flow sufficiently for it to fully impregnate the reinforcement. The impregnated web, also known as a prepreg, is then cooled by a refrigeration unit 26 to a temperature lower than 10° C. to allow the epoxy resin to recrystallize. The prepreg is then stored at a temperature, preferably −5° C. to +10° C., for 2 days to complete the crystallization process. Once the epoxy resin is fully crystallized the prepreg can be stored at room temperature or below the melting point of the epoxy resin.

Another process for producing a crystalline epoxy prepreg entails spraying a solids mixture of the powdered crystalline epoxy resin and the powdered epoxy curing agent directly onto the reinforcement. This is then a useable crystalline prepreg. Such techniques include electrostatic and fluidised bed technologies.

Referring to FIG. 3, a further alternative process for making prepregs in accordance with the invention is shown. A solid crystalline epoxy is heated to a temperature above its melting point and is then allowed to cool to room temperature to form a liquid epoxy. A crystalline epoxy is heated to a temperature above its melting point and is then allowed to cool to room temperature. A crystalline epoxy curing agent is then uniformly mixed with the liquid epoxy and a flexibilizing agent to provide a mixture which is held in a bath 31. The reinforcement web, 36a or 36b, is immersed in the bath 31 to wet the web. Excess resin is then removed by metering rolls 32 to achieve the required resin content. The web can then be fed, if required to achieve full impregnation, through a heater and compaction rolls 33 via which heat is applied to a temperature which is lower than the melting point of the epoxy resin. A mixture 35 of epoxy resin and tackifier may be added via lamination of a pre-coated film to either or both sides of the main web if required. The impregnated web, or prepreg, is then cooled by a refrigeration unit 34 to a temperature lower than the melting point of the epoxy resin but preferably to a temperature lower than 10° C. to allow the epoxy resin to recrystallize. The prepreg is then stored at a temperature, preferably −5° C. to +10° C., for 2 days to complete the crystallization process. Once the epoxy resin is fully crystallized the prepreg can be stored at room temperature or below the melting point of the epoxy resin. The liquid resin dip process can be achieved using a wide range of equipment well known to those skilled in the art.

It is noted that in all the processes described above, the property enhancement layers can be applied by spraying onto the prepreg online or they can be applied via release paper. The fibers may be embedded into the resin to different degrees. For example, the fibers may be completely embedded within the resin so that the fibers are entirely surrounded by a resin matrix. Alternatively, the fibers may be only partially embedded including situations where the fibers are embedded to a minimal degree and sitting on top of the resin.

In order that the present invention may be more readily understood, specific examples thereof are provided hereinbelow.

EXAMPLE 1

Ten grams of DER 332 as supplied by Dow Chemical, a diglycidyl ether of bisphenol A, which can exist as a liquid resin or a crystalline solid was warmed to 45° C. to ensure that no crystallinity was present. The resin was allowed to cool to room temperature. 1-(1-Imidazolyl)-2-hydroxyoctadecane, the epoxy curing agent (hereinafter referred to as curing Agent I) was added to the epoxy resin and mixed uniformly using a stirring rod. The mixture was then allowed to recrystallize at a temperature of 5° C. for two days. Crystals of the DER 332 can be added to the mixture to nucleate the crystallization process. The epoxy composition was then allowed to warm to room temperature. On reaching this temperature it was observed that a solid composition was isolated. Differential scanning calorimetry (DSC) was used as a method to detect the melting point of the epoxy resin and the epoxy resin curing agent. The melting points can then be compared with separate DSC traces of the pure components of the composition. DSC was also used to check the outlife of the composition over six months. The room temperature shelf life of the crystalline composition is at least four months.

Results are shown in Table 1

TABLE 1

| Sample | Mpt peak 1 (° C.) | Mpt peak 2 (° C.) |
|---|---|---|
| DER 332 | 42.1 | — |
| Curing Agent I | 73.8 | — |
| DER 332 + Curing Agent I | 42.6 | 73.7 |

The melting point peaks in the epoxy resin composition correspond to the melting point peaks of the individual pure components.

COMPARATIVE EXAMPLE 1

To ten grams of LY1556 as supplied by Vantico a diglycidyl ether of bisphenol A, which is a non-crystallizable liquid resin, was added one gram of Curing Agent I. This composition was uniformly mixed using a stirring rod. The mixture was left for 2 days at 5° C. The mixture was warmed to room temperature. The mixture was still in the liquid form, the DSC trace only showed the melting point peak of the epoxy curing agent. The room temperature shelf life of this composition was determined to be five weeks.

EXAMPLE 2

Ten grams of Rutapox 0158 as supplied by Bakelite, a diglycidyl ether of bisphenol F, which can exist as a liquid resin or a crystalline solid was warmed to 45° C. to ensure that no crystallinity was present. The resin was allowed to cool to room temperature. Epoxy Curing Agent I was added to the epoxy resin and mixed uniformly using a stirring rod. The mixture was then allowed to recrystallize at a temperature of 5° C. for one day. The epoxy resin composition was then allowed to warm to room temperature. On reaching this temperature it was observed that a solid composition was isolated. Differential scanning calorimetry (DSC) was used to detect the melting point of the epoxy resin and the epoxy resin curing agent. The melting points can then be compared with separate DSC traces of the pure components of the compositions. DSC was also used to check the outlife of the composition over six months. The room temperature shelf life of the crystalline composition is at least four months.

Results are shown in Table 2.

TABLE 2

| Sample | Mpt peak 1 (° C.) | Mpt peak 2 (° C.) |
|---|---|---|
| Rutapox 0158 | 41.5 | — |
| Curing Agent I | 73.8 | — |
| Rutapox 0158 + Curing Agent I | 73.4 | 41.4 |

The melting point peaks in the epoxy resin composition correspond to the melting point peaks of the individual pure components.

COMPARATIVE EXAMPLE 2

To ten grams of GY281 as supplied by Vantico, a diglycidyl ether of bisphenol F, which is a non-crystallizable liquid resin at room temperature, was added one gram of epoxy Curing Agent I. This composition was uniformly mixed using a stirring rod. The mixture was left for 2 days at 5° C. The mixture was warmed to room temperature. The mixture was still in the liquid form, the DSC trace only showed the melting point peak of the epoxy curing agent. The room temperature shelf life of this composition was determined to be five weeks.

EXAMPLE 3

One kilogram of DER 332 was warmed at 45° C. to ensure no crystalline solid was present. The mixture was allowed to cool to room temperature. One hundred grams Curing Agent I was added and blended thoroughly using a planetary mixer. The epoxy composition was then impregnated on carbon fabric at a resin weight of 35–40 weight percent using a prepreg machine. The impregnated fabric was passed over a 5° C. cooling plate to initiate crystallization. The epoxy prepreg was covered with a polyethylene wrap and rolled up. The prepreg was immediately stored at 5–10° C. for two days to ensure complete recrystallization. DSC showed melting point peaks for both DER 332 and Curing Agent I. The epoxy prepreg composition had a room temperature storage life of six months.

EXAMPLE 4

To one hundred grams of crystalline Rutapox 0158 was added ten grams of Curing Agent I. This mixture was ground together using a pestle and mortar. This mixture was spread evenly over a 200 $gm^{-2}$ weight carbon fabric and warmed to 45° C. to melt the crystalline Rutapox 0158. The resin content of the prepreg was between 35–40 weight percent. Using a K-bar the resin mixture was impregnated into the carbon fabric. The prepreg was cooled to below 10° C. to allow recrystallization of the epoxy resin. The epoxy prepreg composition has a storage life greater than six months at room temperature.

EXAMPLE 5

A powdered mixture of one hundred grams crystalline Rutapox 0158 and ten grams of Curing Agent was sprayed on carbon fabric. The resin content of the prepreg was between 35–40 weight percent. The epoxy prepreg composition has a storage life greater than six months.

EXAMPLES 6

A crystalline prepreg was prepared as in example 3. The prepreg was allowed to warm to room temperature. A tackifying layer was added to the prepreg by spraying a water-based contact adhesive (3M Fastbond 30) to both sides of the prepreg. The prepreg was stored between polyethylene wrap at room temperature for 28 days and its tack monitored. The tack was sufficient to allow prepreg plies to adhere to each other at room temperature. This tack was maintained throughout the 28 days room temperature storage period.

EXAMPLE 7

One hundred grams of Rutapox 0158 as supplied by Bakelite, a diglycidyl ether of bisphenol F, which can exist as a liquid resin or a crystalline solid was warmed to 45° C. to ensure that no crystallinity was present. Ten grams of epoxy Curing Agent I was added to the epoxy resin and mixed uniformly using a stirring rod. Five grams of Hycar 1300×18, a liquid rubber as supplied by BF Goodrich was added to the mixture and was mixed uniformly using a stirring rod. The epoxy composition was then impregnated on carbon fabric at a resin weight of 35–40 weight percent using a K-bar. The prepreg was stored between silicone coated release paper at 5–10 C. to ensure complete recrystallisation. The prepreg was then allowed to warm to room temperature and was shown to be flexible since little or none of the epoxy resin flaked off the fabric.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the above preferred embodiments and examples, but is only limited by the following claims.

What is claimed is:

1. An uncured composite material comprising:
   an uncured composite body having at least one side, said composite body comprising fibers and a substantially crystallized solid matrix, said solid matrix comprising a solids mixture of a crystallized epoxy resin and a solid curing agent, wherein said side of said uncured composite body has a certain level of tackiness and said uncured composite body has a certain degree of flexibility; and
   one or more property enhancement agents located on said side of said uncured composite body, said property enhancement agent or agents present in a sufficient amount to provide an increase in the tackiness of said uncured composite body and an increase in the flexibility of said uncured composite body.

2. An uncured composite material according to claim 1 wherein said curing agent is substantially crystallized.

3. An uncured composite material according to claim 1 wherein said crystallized epoxy resin consists essentially of crystals that have melting points that are between about 25° C. to 100° C.

4. An uncured composite material according to claim 3 wherein said crystallized epoxy resin is made from the group of epoxy resins consisting of crystallizable bisphenol-A diglycidyl ether, crystallizable bisphenol-F diglycidyl ether and crystallizable halogenated derivatives thereof.

5. An uncured composite material according to claim 1 wherein said solid curing agent has a melting point that is higher than the crystal melting point of said crystallized epoxy resin.

6. An uncured composite material according to claim 1 wherein said property enhancement agent is selected from the group consisting of adhesives, diluents, plasticizers and flexibilizing agents.

7. An uncured composite material according to claim 1 wherein said fibers are in the form of a fabric and wherein said uncured composite body comprises a first side and a second side, and wherein said property enhancement layer is located on at least one of said first or second sides.

8. An uncured composite material according to claim 1 wherein said solid matrix further includes an additive selected from the group consisting of flexibilizing agents, inorganic fillers, flame retardants, pigments, dies, ultraviolet light absorbers, wetting agents, viscosity modifiers, toughening particles and accelerators.

9. A method for storing an uncured composite material, said method comprising the steps of:
   providing an uncured composite body having at least one side, said composite body comprising fibers and a substantially crystallized solid matrix, said solid matrix comprising a solids mixture of a crystallized epoxy resin and a crystallized curing agent wherein said epoxy resin has a crystal melting point and said curing agent has a crystal melting point wherein said side of said uncured composite body has a certain level of tackiness and said uncured composite body has a certain degree of flexibility, said uncured composite material further comprising a property enhancement layer located on said side of said uncured composite body, said property enhancement layer comprising a sufficient amount of a property enhancement agent to provide an increase in the tackiness of said uncured composite body and an increase in the flexibility of said uncured composite body; and storing said uncured composite body at a temperature that is below the crystal melting points of both said epoxy resin and said curing agent.

10. A method for storing an uncured composite material according to claim 9 wherein said crystallized epoxy resin consists essentially of crystals that have melting points that are between about 25° C. to 100° C.

11. A method for storing an uncured composite material according to claim 10 wherein said crystallized epoxy resin is made from the group of epoxy resins consisting of crystallizable bisphenol-A diglycidyl ether, crystallizable bisphenol-F diglycidyl ether and crystallizable halogenated derivatives thereof.

12. A method for storing an uncured composite material according to claim 9 wherein said crystallized curing agent has a crystal melting point that is higher than the crystal melting point of said crystallize epoxy resin.

13. A method for storing an uncured composite material according to claim 9 wherein said property enhancement agent is selected from the group consisting of adhesives and flexibilizing agents.

14. A method for storing an uncured composite material according to claim 9 wherein said fibers are in the form of a fabric and wherein said uncured composite body comprises a first side and a second side, and wherein said property enhancement layer is located on at least one of said first or second sides.

15. A method for storing an uncured composite material according to claim 9 wherein said solid matrix further includes an additive selected from the group consisting of flexibilizing agents, inorganic fillers, flame retardants, pigments, dyes, ultraviolet light absorbers, wetting agents, viscosity modifiers, toughening particles and accelerators.

16. A method for storing an uncured composite material according to claim 9 wherein said uncured composite body is stored at room temperature.

17. A method for storing an uncured composite material comprising the steps of:

providing an uncured composite body having at least one side, said composite body comprising fibers and a substantially crystallized solid matrix, said solid matrix comprising a solids mixture of a crystallized epoxy resin and a solid curing agent wherein said epoxy resin has a crystal melting point and said solid curing agent has a melting point, wherein said side of said uncured composite body has a certain level of tackiness and said uncured composite body has a certain degree of flexibility such that a certain amount of said solid matrix flakes from said uncured composite body when said uncured composite body undergoes flexing, and wherein said composite material further includes a property enhancement layer located on said side of said uncured composite body, said property enhancement layer comprising a sufficient amount of a property enhancement agent to provide an increase in the tackiness of said uncured composite body, an increase in the flexibility of said uncured composite body and/or a reduction in the amount of said solid matrix flaking from said uncured composite body; and storing said uncured composite body at a temperature that is below the crystal melting point of said epoxy resin and below the melting point of said curing agent.

18. A method for storing an uncured composite material according to claim 17 wherein said uncured composite body is stored at room temperature.

19. A method for storing an uncured composite material according to claim 17 wherein said curing agent is substantially crystallized.

20. A method for storing an uncured composite material according to claim 17 wherein said crystallized epoxy resin consists essentially of crystals that have melting points that are between about 25° C. to 100° C.

21. A method for storing an uncured composite material according to claim 17 wherein said crystallized epoxy resin is made from the group of epoxy resins consisting of crystallizable bisphenol-A diglycidyl ether, crystallizable bisphenol-F diglycidyl ether and crystallizable halogenated derivatives thereof.

22. A method for storing an uncured composite material according to claim 18 wherein said solid curing agent has a melting point that is higher than the crystal melting point of said crystallized epoxy resin.

23. A method for storing an uncured composite material according to claim 18 wherein said property enhancement agent is selected from the group consisting of adhesives and flexibilizing agents.

24. A method for storing an uncured composite material according to claim 18 wherein said fibers are in the form of a fabric and wherein said uncured composite body comprises a first side and a second side, and wherein said property enhancement layer is located on at least one of said first or second sides.

25. A method for storing an uncured composite material according to claim 18 wherein said solid matrix further includes an additive selected from the group consisting of flexibilizing agents, inorganic fillers, flame retardants, pigments, dyes, ultraviolet light absorbers, wetting agents, viscosity modifiers, toughening particles and accelerators.

26. A method for making an uncured composite material comprising the steps of:

forming an uncured composite body having at least one side, said composite body comprising fibers and a substantially crystallized solid matrix, said solid matrix comprising a solids mixture of a crystallized epoxy resin and a solid curing agent, wherein said side of said uncured composite body has a certain level of tackiness and said uncured composite body has a certain degree of flexibility wherein a certain amount of said solid matrix flakes from said uncured composite body when said uncured composite body undergoes flexing; and forming a property enhancement layer located on said side of said uncured composite body, said property enhancement layer comprising a sufficient amount of a property enhancement agent to provide an increase in the tackiness of said uncured composite body, an increase in the flexibility of said uncured composite body and/or a reduction in the amount of said solid matrix flaking from said uncured composite body.

27. A method for making an uncured composite material according to claim 26 wherein said epoxy resin is thermally reversible between a liquid form and a solid form wherein said liquid form is substantially crystal free at or above a given temperature and said solid form is substantially crystallized at or below a given temperature, said step of forming said uncured composite body comprising the steps of:

provide a liquid mixture comprising said solid curing agent dispersed in said epoxy resin in said liquid form;

combining said liquid mixture with said fibers to form a composite body precursor; and cooling said composite body precursor to a sufficient temperature for a sufficient time to substantially crystallize said epoxy resin and thereby form said uncured composite body.

28. A method for making an uncured composite material according to claim 26 wherein said epoxy resin is thermally reversible between a liquid form and a solid form wherein said liquid form is substantially crystal free at or above a given temperature and said solid form is substantially crystallized at or below a given temperature, said step of forming said uncured composite body comprises the steps of:

providing a solid mixture comprising said solid curing agent dispersed in said epoxy resin in said solid form;

combining said solid mixture with said fibers.

29. A method for making an uncured composite material according to claim 27 that comprises the step of adding crystals of epoxy resin to said liquid mixture to promote crystallization of said epoxy resin during said cooling step.

* * * * *